United States Patent
Park et al.

(10) Patent No.: US 6,710,886 B2
(45) Date of Patent: Mar. 23, 2004

(54) SEMICONDUCTOR WAFER POSITION DETECTING SYSTEM, SEMICONDUCTOR DEVICE FABRICATING FACILITY OF USING THE SAME, AND WAFER POSITION DETECTING METHOD THEREOF

(75) Inventors: In-Hak Park, Kyonggi-do (KR); Chul Park, Cheju-do (KR); Sang-Hee Han, Kwangju (KR); Tae-Hoon Kim, Kyonggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 48 days.

(21) Appl. No.: 10/027,641

(22) Filed: Dec. 19, 2001

(65) Prior Publication Data

US 2002/0101596 A1 Aug. 1, 2002

(30) Foreign Application Priority Data

Jan. 26, 2001 (KR) .......................... 2001-3676

(51) Int. Cl.⁷ .............................................. G01B 11/14
(52) U.S. Cl. ....................................... 356/614; 356/399
(58) Field of Search ................................ 356/399–401, 356/614, 622, 623; 250/548; 134/140, 153, 157, 201; 355/55, 61, 53, 77

(56) References Cited

U.S. PATENT DOCUMENTS

| | | | | |
|---|---|---|---|---|
| 4,029,351 A | * | 6/1977 | Apgar et al. ............... | 294/64.3 |
| 4,298,273 A | * | 11/1981 | Nishizuka et al. ............ | 355/61 |
| 4,887,904 A | * | 12/1989 | Nakazato et al. ............ | 356/621 |
| 5,194,743 A | * | 3/1993 | Aoyama et al. ............. | 250/548 |
| 5,979,475 A | * | 11/1999 | Satoh et al. ................ | 134/140 |
| 6,131,589 A | * | 10/2000 | Vogtmann et al. .......... | 134/113 |

* cited by examiner

Primary Examiner—Hoa Q. Pham
(74) Attorney, Agent, or Firm—Marger Johnson & McCollom, P.C.

(57) ABSTRACT

It is disclosed a semiconductor wafer position detecting system, a semiconductor device fabricating facility of using the same, and a semiconductor wafer position detecting method to prevent process failure in advance prior to proceeding various processes.

The structure includes a chuck plate formed with at least one or more holes at a portion thereof on which a wafer is normally and closely placed; a fluid line connected between a lower portion of each of the holes and a fluid flow device; at least one or more valves provided on the fluid line to control fluid flow in response to an opening/closing control signal; a sensor provided on the fluid line to detect a state of fluid; an output device for outputting signals in response to an output control signal; and a controller for selectively applying an opening/closing control signal and an output control signal to the valve and output device, and detecting the position state of wafer by a measurement signal applied from the sensor.

18 Claims, 4 Drawing Sheets

SEMICONDUCTOR WAFER POSITION DETECTING SYSTEM, SEMICONDUCTOR DEVICE FABRICATING FACILITY OF USING THE SAME, AND WAFER POSITION DETECTING METHOD THEREOF

BACKGROUND OF THE INVENTION

1. Field of the Invention

The present invention relates to a semiconductor wafer position detecting system, semiconductor device fabricating facility of using the same, and wafer position detecting method thereof, by which the position state of wafers is detected prior to performing processes in order to prevent failure in the processes.

2. Description of the Related Art

A semiconductor device fabricating facility includes vacuum chambers for performing processes such as chemical vapor deposition, etching, or metal deposition in vacuum chambers provide a clean environment and prevent wafer pollution during processing. The chamber is made of an opaque material such as metal that has sufficient strength to withstand the vacuum.

As shown in FIG. 1, a wafer W placed into the fabricating facility and supported on a chuck plate can detach from the upper surface of the chuck plate 10 if particles P (such as pieces of wafer) are left on the chuck plate 10. In addition, as shown in FIG. 2, the wafer W slips on the particles and is displaced from the predetermined position in the course of being transferred or placed on the chuck plate 10.

However, with the conventional facility it is difficult to determine whether the wafer is properly transferred to or placed on a predetermined position. Sometimes, it is necessary to open the chamber in order to confirm the position of the wafer.

Assembling or disassembling repeatedly such the vacuum chamber to verify the position of the wafer causes trouble in maintaining a vacuum in the chamber, lengths overall processing time, working hours, increasing the amount of work done, and more labor power. In addition, the repeated assembling and disassembling of the fabricating facility reduces the productivity of the fabricating facility, and wafers can be contaminated opening of the chamber.

In order to change and improve such environments, a conventional vacuum chamber fabricating facility is provided with a transparent window to see into the chamber. However, this configuration causes a problem that a user cannot confirm whether a wafer has been damaged, e.g., in the edge of wafer broken or cracked.

Such a transparent window in the predetermined portion of the chamber becomes covered with deposited polymers that are generated during processes and becomes opaque. It is impossible to confirm whether wafers are damaged even in instances where a plurality of wafers are folded or broken.

The transparent window also does not permit a user to confirm whether wafers in the fabricating facility are damaged or broken or contaminated by pollutants including particles.

SUMMARY OF THE INVENTION

It is an object of the present invention to provide a semiconductor wafer position detecting system, chuck assembly of using the same, and semiconductor wafer position detecting method thereof, which allows one to confirm whether wafers are normally transferred, whether wafers are properly positioned, and whether wafers have detached from the chuck plate without disassembling or assembling the fabricating facility. Thereby, the number of times in assembling and disassembling the fabricating facility, working hours and the amount of work done can be reduced, so that the rate of operation and productivity of the fabricating facility are increased and wafers are prevented from being contaminated.

In order to achieve the object, the semiconductor wafer position detecting system includes:

a chuck plate formed with at least one or more holes at a portion thereof on which a wafer is normally and closely placed;

a fluid line connected between a lower portion of each of the holes and a fluid driving means;

at least one or more valves provided on the fluid line to control fluid flow in response to an opening/closing signal;

a sensor provided on the fluid line to detect a pressure state of the fluid;

an output device for outputting in response to an output control signal; and a controller for selectively applying an opening/closing signal and an output control signal to the valve and output device, and detecting the position state of wafer by a measurement signal applied from the sensor.

The chuck plate upper surface includes one or more guiding grooves that communicate with the upper portion of at least one or more holes.

It is desirable that the guiding groove is formed within the region where a wafer is normally placed within the normal position of and the edge of the wafer.

The guiding groove may be formed in a radial direction or spiral direction relative to the center the wafer in the normal position, or may be formed along circumferences having different diameters relative to the center of the wafer in its normal position, or may be a combination of the radial shape, spiral shape and circumference shape.

The fluid line is configured so that the fluid flows from one side of the fluid line through the guiding groove and discharges through the other side of the fluid line after the wafer is normally placed on the center position of the chuck plate.

The sensor may use a pressure gage that measures pressure in the fluid line, or a flowmeter for detecting a flow rate of fluid in the fluid line.

It is effective that at least one or more optical sensors are further provided above and opposite to the portion of the chuck plate where the edge of wafer is placed to thereby detect the position of the edge of wafer and output the resultant signal to the controller.

The wafer detecting system further comprises a rotational driving apparatus for rotating the chuck plate in response to a rotational control signal selectively applied from the controller.

The output device is configured by combining at least one or more out of a bell giving an alarm, a lamp outputting a light signal, a monitor displaying the position state of wafer, and a switching part for selectively cutting off an electric power applied to each of the elements of the system in response to a signal generated by the controller when a wafer is improperly positioned.

The semiconductor fabricating facility provided therein with a wafer position detecting system according to another embodiment of the present invention, includes:

a chamber provided with an opening/shutting apparatus for opening or shutting the chamber in response to an opening /shutting control signal;

a chuck plate provided in the chamber to rotate and formed thereon with at least one or more holes;

a rotational driving apparatus provided under the chuck plate to rotate the chuck plate in response to a rotational control signal;

a fluid line communicated with each of the holes to form a fluid path;

a valve provided on the fluid line to control a fluid flow in response to a fluid flow control signal;

a sensor provided on the fluid line to detect a state of the fluid;

an output device for outputting in response to an output control signal; and a controller receiving a signal of the sensor to detect the position the wafer, outputting the resultant signal to the output device and outputting the rotational control signal and fluid flow control signal to the rotational driving apparatus and valve.

It is preferred that the chamber is further provided therein with a vacuum forming apparatus for forming a vacuum state thereof.

The wafer position detecting method of the wafer position detecting system includes:

providing a chuck plate formed with at least one or more holes at a portion thereof on which a wafer is normally and closely placed; a fluid line communicated with a lower portion of each of the holes; at least one or more valves provided on the fluid line to control fluid flow in response to an opening/closing signal; a sensing means provided on the fluid line to detect a state of the fluid; an output means for outputting in response to an output control signal; and a controller for selectively applying an opening/closing signal and an output control signal to the valve and output device, and detecting the position of wafer by a measurement signal applied from the sensor.

A wafer on the chuck plate; controlling fluid to flow through the fluid line; detecting a pressure or a fluid flow state in the fluid line; checking a contact state and position state of wafer on the chuck plate according to whether a measured value is within a predetermined scope to control fluid flow through the valve; and outputting through the output device information including the measured values to the pressure or fluid flow state, set values, and probe gas supplied state.

It is effective that the wafer position detecting system further includes at least one or more optical sensors provided above the chuck plate to detect the position of the edge of the wafer. The wafer detecting method further includes the step of detecting a position of the edge of the wafer by the optical sensor prior to checking the position of wafer.

It is desirable that the wafer position detecting system further includes a rotational driving apparatus to rotate the chuck plate. The wafer position detecting method includes the step of detecting a position the edge of the wafer on the chuck plate to correspond to the optical sensor.

The wafer position detecting method further comprises the step of controlling a fluid flow by the valve when the wafer is abnormally placed.

BRIEF DESCRIPTION OF THE DRAWINGS

The foregoing and other objects, aspects and advantages will be better understood from the following detailed description of preferred embodiments of the invention with reference to the drawings, in which.

DETAILED DESCRIPTION OF THE PREFERRED EMBODIMENTS

Hereinafter, the semiconductor wafer position detecting system, semiconductor device fabricating facility provided with the same and wafer position detecting method thereof will be explained with reference to the accompanying drawings.

Figure 1:
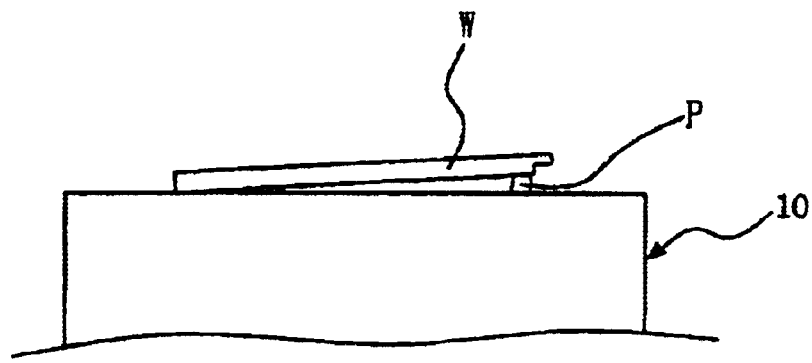
FIG. 1 is a cross sectional view showing an abnormally placed wafer on a chuck as an example.
Figure 2:
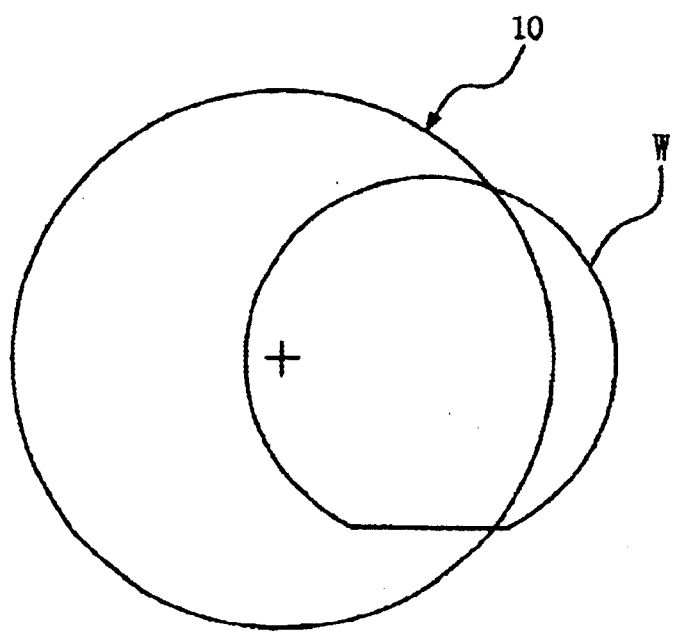
FIG. 2 is a plane view showing an abnormally placed wafer on a chuck as another example.
Figure 3:
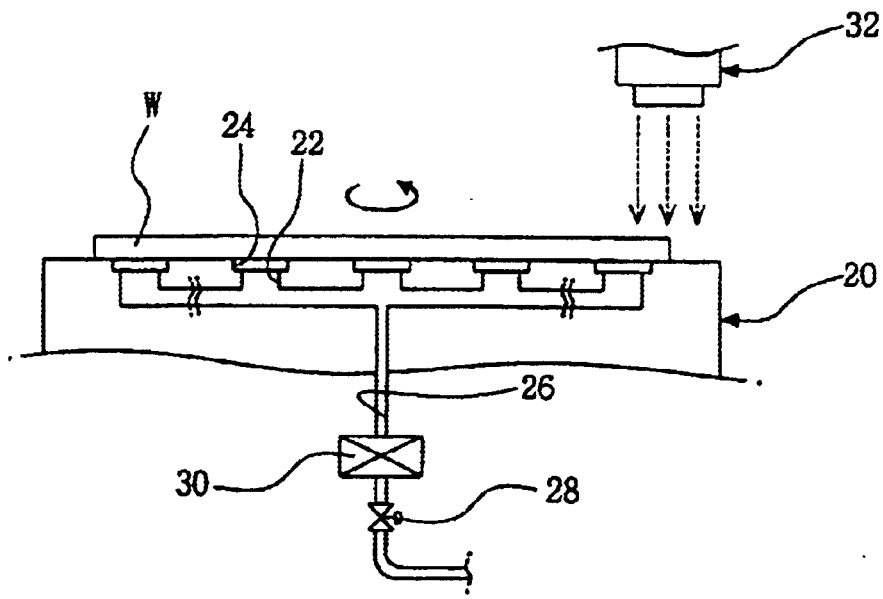
FIG. 3 is a cross sectional schematic view showing the structure of a semiconductor wafer position detecting system according to an embodiment of the present invention.

As shown in FIG. 3, the semiconductor wafer position detecting system comprises a chuck plate 20 for supporting and fixing the wafer W transferred and placed thereon, and formed with at least one or more holes 22 within the predetermined area where a wafer is normally placed.

The chuck plate 20 is formed with an upper surface having one or more guiding grooves 24. At least one or more of the guiding grooves 24 communicate with the upper portion of at least one or more holes 22. Accordingly, some or all of the holes 22 communicate with the guiding grooves 24.

The guiding grooves 24 are formed within the region where a wafer W is normally placed and the edge of the wafer W is not beyond. When the wafer W is normally placed on and adheres closely to the chuck 20, the guiding groove 24 is covered by the wafer W to thereby form closed fluid flow path.

Figure 4:
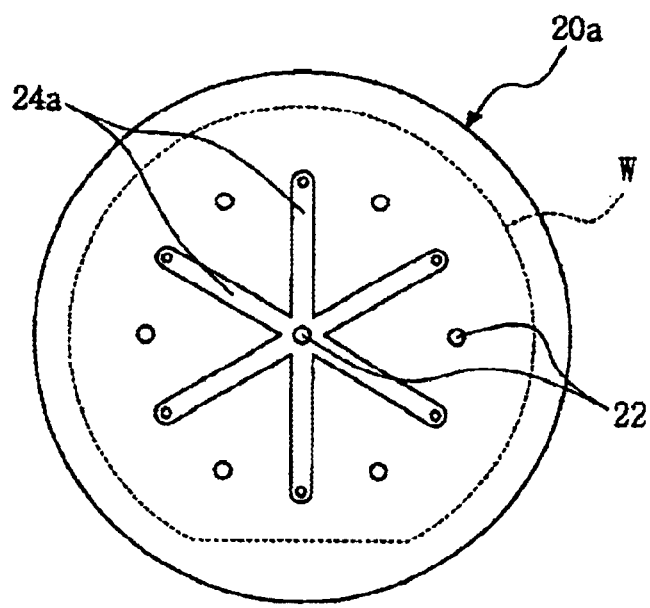
FIG. 4 is a plane view showing guiding grooves formed on the chuck plate shown in FIG. 3.

Referring to FIG. 4, the guiding grooves 24 may be arranged in a radial direction or spiral direction (not shown) relative to the center of the wafers W as normally placed.

Figure 5:
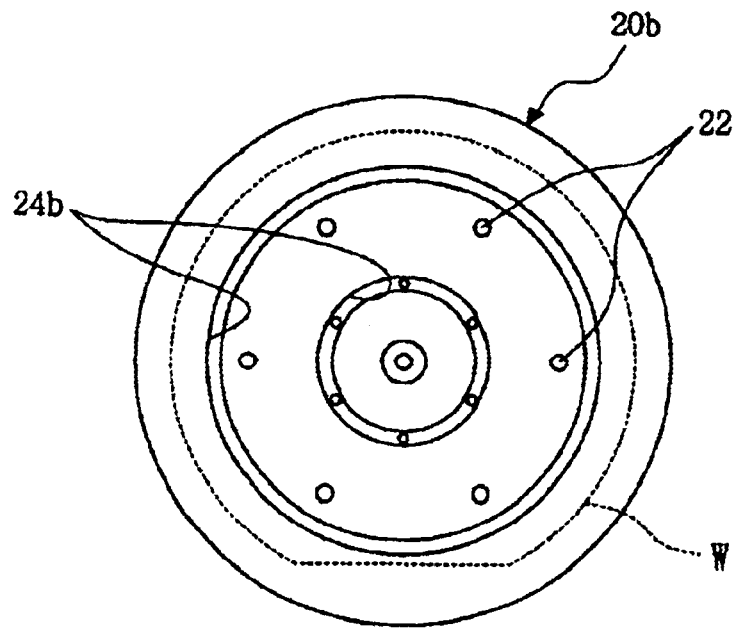
FIG. 5 is a plane view showing guiding grooves formed on the chuck plate shown in FIG. 3 according to another embodiment of the present invention.

Referring to FIG. 5, the guiding grooves 24b may be arranged along the circumferences having different diameters relative to the central position the wafer W is normally placed.

Figure 6:
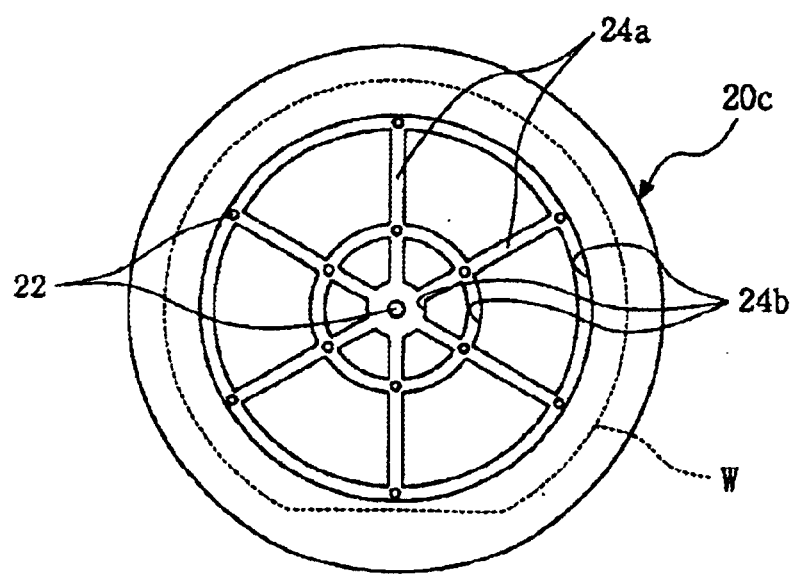
FIG. 6 is a plane view showing the arrangement of guiding grooves as a combination of the arrangements of guiding grooves shown in FIGS. 4 and 5.

As shown in FIG. 6, the guiding grooves may be arranged in a combination shape of the radial shape, spiral shape, and circumference shape.

As shown in FIG. 3, the fluid line 26 is connected to a fluid flow device, such as a pump, (not shown) and communicates with the lower portion of the hole 22 to thereby form fluid path. The fluid line 26 is provided thereon with at least one or more valve 28 for controlling fluid flow in response to a fluid flow control signal. The fluid line 26 is provided thereon with a sensor 30 to detect a fluid state therein. The sensor 30 may utilize a pressure gage or a flowmeter to detect the pressure, or the movement of fluid in the fluid line 26. The fluid line 26 may communicates with the fluid flow device and the hole 22. The fluid line 26 may be configured so that fluid is supplied from one side of the fluid line to flow through the guiding groove 24 and is discharged through the other side of the fluid line 26 after the wafer W is placed on the center position of the chuck plate 20.

A controller (not shown) is provided in the system to output a fluid flow control signal to the valve 28. The controller receives a signal having information of the state of the fluid line 26 from the sensor 30 and compares it with a set value to check the position state of wafer W on the chuck plate 20.

The controller outputs to the output device (not shown) information including the operational state of the facility, the state of the process, and the position state of wafer W, thereby allowing a user to confirm the states.

The output device includes at least one of a bell giving an alarm, a lamp outputting a light signal, a monitor displaying the position state of wafer, and a switching part for selectively cutting off an electric power applied to each of the elements of the system in response to a signal generated by the controller when a wafer is abnormally placed.

At least one or more optical sensors 32 are further provided above and adjacent to a portion of the chuck plate 20 where the edge of wafer W is normally placed to detect the position of the edge of wafer and output the resultant signal to the controller. The optical sensor 32 serves to illuminate the edge portion of the wafer W with a predetermined probing beam and detect by a reflected beam or diffracted beam from the wafer as to whether the wafer W is damaged or normally placed or folded or broken.

The rotational driving apparatus (not shown) is further provided in the system to rotate the chuck plate 20 around the center position where the wafer W is normally placed.

Accordingly, the optical sensor 32 is allowed to detect the position state of the whole edge portion of wafer W.

According to such a semiconductor wafer position detecting system, first, the wafer W is transferred to the chuck plate 20 and placed on the chuck plate 20. The controller outputs the fluid flow control signal to control opening and closing the valve 28. When the valve 28 is opened in response to the signal, the fluid line 26 is formed therein with the pressure of fluid from the fluid flow device, and the sensor 30 detects the pressure of the fluid line 26 or the flow of fluid.

Here, the fluid flow device may be formed with a vacuum forming means such as a vacuum pump to make the fluid line 26 vacuous, or formed with a gas supply means to supply a probe gas through the fluid line 26.

First, the fluid flow device formed with the vacuum forming apparatus will be explained in more detail. Vacuum that is formed through the fluid line 26 may allow the wafer W to adhere to the chuck plate due to its vacuum pressure. The vacuum pressure can be used as a fixing means for fixing the wafer to the chuck plate.

The sensor 30 communicating with the fluid line 26 serves to detect the pressure state of the fluid line 26 in instance where the sensor 30 is a pressure gage, and to detect fluid flow in the instance where the sensing means is a flowmeter.

The sensor 30 outputs the resultant signal to the controller. The controller compares the detected pressure of the fluid line 26 with the set pressure, as a reference pressure when a wafer W is normally placed on the chuck plate. Or, the controller may compare the detected value, which indicates the fluid flowing state in the fluid line 26, with the reference state that is set when the wafer W is normally placed.

Meanwhile, in case that the fluid flow device is constructed with a gas supplier which supply a probe gas, the chuck plate 20 is provided with a wafer fixing means by which a wafer is fixed by its own weight, or to which a separate vacuum forming means is connected to fix a wafer W to the chuck plate by the vacuum force, or in which an electrostatic chuck is provided to fix a wafer to the chuck plate by the electrostatic force, thereby preventing a wafer W from moving away from its normally placed position on the chuck plate.

Under such a state, when the controller outputs the fluid flow control signal to open or shut down the valve 28, the probe gas that is supplied from the gas supplier flows under the wafer W via the fluid line 26 while maintaining the predetermined pressure to fasten the wafer W to the chuck plate.

At this time, an amount of probe gas is supplied until the wafer W placed on the chuck plate 20 cannot detach from the chuck plate. Particularly, it is further required that the amount of probe gas which is supplied should be controlled when the pressure outside of the fluid line 26 is relatively lower than that in the fluid line 26.

Here, in case that the fluid line 26 is formed as a single body, the probe gas supplied from a gas supplier when the valve 28 is opened is distributed in the fluid line 26, hole 22, and guiding groove 24. At this time, the pressure in the fluid line 26 is different from that in the environment in which the wafer W is placed and detected due to the difference in pressure between the fluid line 26 and the environment, that is, outside of the fluid line.

In case that the sensor 30 provided on the fluid line 26 is constructed by a pressure gage, the sensor 30 serves to detect the pressure state in the fluid line 26, which is discriminated by the pressure in the environment outside of the fluid line 26. In case that the sensor 30 is constructed by a flowmeter, the sensor 30 serves to detect the flow state of fluid in the fluid line 26. And, the sensor 30 outputs the resultant signal having the detected information.

The controller compares the detected pressure in the fluid line 26 with a reference value of pressure which is set when the wafer W is normally placed on the chuck plate 2, or the detected value of the flow state in the fluid line 26 with a reference value of fluid flow state which is set when the wafer W is normally placed on the chuck plate 20, thereby determining whether the wafer W is normally placed or not.

Meanwhile, the fluid line 26 can be constructed so that fluid may flow from an inlet to an outlet through the guide groove 24 formed on the chuck plate 20. In case that the inlet to supply fluid and outlet to discharge the fluid are separately formed in the fluid line 26 based on the guide groove 24, it is desirable that a fluid flow device be a gas supply as described above. In this case, the gas supply can be designed so that the probe gas may flow through the fluid line 26 having the inlet and outlet including the guide groove 24.

Also, it is desirable that the sensor 30 is formed of a flowmeter to detect the amount of probe gas that flows through the fluid line 26.

In these procedures, if any particles such as pieces of broken wafer exist on the chuck plate 20, the wafer detaches from the surface of the chuck plate or is improperly placed on the chuck plate, thereby the guide groove 24 and hole 22 are exposed to an outside environment out of the surface of the chuck plate 20. As a result, the detected values of pressure and flow state in the fluid line 26 become different from the reference values.

Accordingly, the controller determines whether the wafer W is properly placed on the chuck plate by comparing the values detected by the sensor 30 with the reference values that are set in the pressure of the fluid line 26 or flow state of fluid, and outputs the resultant signal to an output device to control operation of each of the devices.

Meanwhile, the optical sensor 32 provided above the chuck plate 20 serves to illuminate the edge portion of wafer on the chuck plate with a probe beam to detect the position of the edge portion of wafer W by states of reflected beam or refracted beam.

In addition, under the above-mentioned state, the rotational driving apparatus serves to rotate the chuck plate 20, the optical sensor 32 detects each of the edge portions of wafer W on the chuck plate 20 in various directions to generate the resultant signal to the controller. Also, the controller detects if the wafer W is broken or damaged or improperly placed by the signals from the optical sensor and the sensor 30. Accordingly, the optical sensor 32 can detect and confirm whether the edge portion of wafer W is damaged or broken. If the wafer is improperly placed on the chuck plate, the wafer can be moved to a normal position on the chuck plate through the guide grooves 24 or the holes 22, thereafter being detected, increasing the reliability in detection.

According to such a construction, the degree to which the wafer W detaches from the chuck plate and the wafer W is improperly placed on the chuck plate can exactly be detected. Thus, a user can confirm whether each element of process chamber is normally operating, or if all of the processes have failed.

Figure 7:
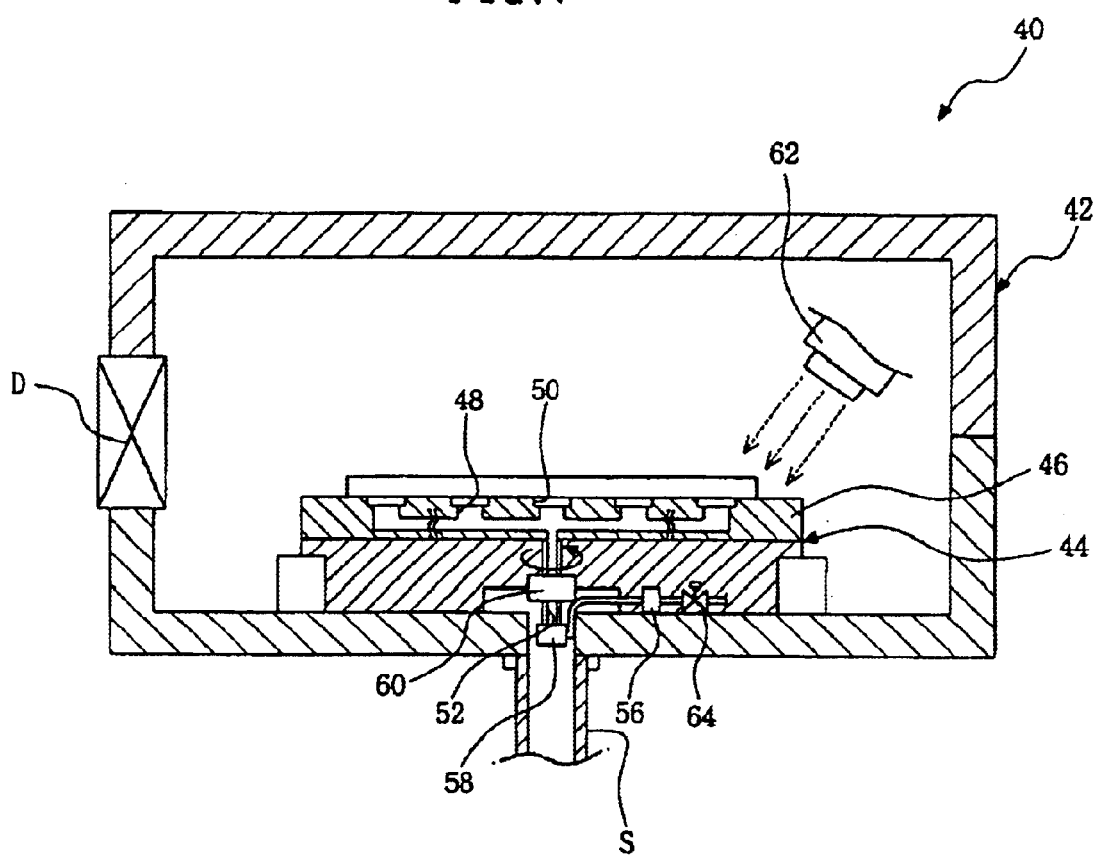
FIG. 7 is a schematic cross sectional view showing the structure of a semiconductor device fabricating facility provided with a wafer position state detecting system according to the present invention.

Turning now to FIG. 7, the semiconductor fabricating facility 40 of using the semiconductor wafer position detecting system is provided a chamber 42 having a door D being opened or closed in response to a door opening/closing signal. The chamber 42 is provided therein with a chuck unit 44 to support a wafer W that is inserted through the door D. The chuck unit 44 is provided with a chuck plate 46 on which the wafer W can be placed. The chuck plate 46 is provided thereunder with a rotational driving apparatus 60 to rotate the chuck plate in response to a rotational control signal.

In addition, the chuck plate 46 is provided thereon with at least one or more holes 48 and guide grooves 50 which are partly shared with the holes 48. The chuck plate 46 is in communication with the fluid line 52 through the end portion of the hole 48 so that fluid pressure caused by a fluid flow device (not shown) can be transmitted.

The fluid line 52 is provided thereon with at least one or more valves 64 to control a fluid flow in response to a fluid flow control signal and a sensor 56 to detect the fluid pressure or fluid flow fluid.

The chamber 42 is in communication at one side thereof with vacuum pressure forming apparatus (not shown) through piping S to provide a predetermined vacuum pressure in the chamber 42. The fluid line 52 may be constructed in such a manner that the vacuum pressure can be supplied thereto by the vacuum pressure forming apparatus through a separate adapter 58 instead of the fluid flow device.

The adapter 58 may be constructed with a three-way valve by which a vacuum pressure can be selectively provided in the chamber 42 and the fluid line 52 through the piping S.

The adapter 58 may also be constructed with a bellows type of pipe or cylinder type of pipe by which an initial environment in the fluid line 52 can be maintained when process gas is provided to the chamber 42, thereby the environments in the fluid line 52 and the chamber 42 can be divided up even when the environment in the chamber is changed.

In addition, at least one or more optical sensor 62 is provided above the chuck plate 6 in order to illuminate the edge portion of wafer W with a probe light beam, as shown in FIG. 7, by which wafer position and wafer position state can be detected based on the degree of the reflected beam or refracted beam.

A controller (not shown) is provided outside the chamber 42 to selectively output a door open/close control signal, a rotational control signal and a fluid flow control signal to the door means (not shown) and rotational driving apparatus 60 and valve 64, respectively. The controller serves to compare the detected signal outputted from the sensor 56 and the optical sensor 62 with the reference values to determine whether the wafer W is normally placed on the chuck plate and output the resultant information to an output device (not shown).

According to the semiconductor device fabricating facility 40 such as constructed, when a wafer W is projected into the chamber 42, the controller serves to form a predetermined vacuum pressure in the chamber 42 through the vacuum forming apparatus. At this time, the controller outputs the fluid flow control signal to control the valve 64 so that fluid may flow through the fluid line 52. The sensor 56 measures a pressure in the fluid line 52 or a flow state of fluid to output the resultant signal to the controller.

In addition, the controller outputs the rotational control signal to the rotational driving apparatus 60 to rotate the chuck plate 46 so that the wafer W may be properly placed on the chuck plate. In this process, the controller allows the optical sensor 62 to detect the position of wafer W and the position of the edge portion of wafer and receives the resultant signal from the optical sensor 62 to compare information concerning the position of wafer W and the position of the edge portion of wafer with the reference values, thereby determining whether the wafer W is properly placed on the chuck plate.

Thereafter, the controller outputs a signal having information concerning the detected states of wafer W to the output device whereby a user easily confirms whether a wafer W is properly placed on the chuck plate.

According to the present invention, the state of wafer W position on the chuck plate can be easily detected by comparing the signals from the sensor on the fluid line and the optical sensor above the chuck plate with the reference values, without disassembling the facility.

In addition, the optical sensor allows to detect whether wafer W detaches from the surface of the chuck plate due to pieces of broken wafer, or whether wafer W gets damaged, thereby increasing the reliability in processes and minimizing the process failure.

According to the present invention, contamination of wafer or facility can be prevented because the frequency of assembling and disassembling the facility is reduced, thereby reducing manpower and working hours and increasing the rate of operation and the yield in production.

The present invention is limited to the detailed embodiments as described above, but it is clear that it would be obvious to a skilled person to modify or change the invention within the spirit or technical scope of the invention. Such modifications and changes may be included in the following claims.

What is claimed is:

1. A semiconductor wafer position detecting system comprising:

a chuck plate having a wafer supporting surface, the wafer supporting surface having one or more holes formed therein;

a fluid line connected between a lower portion of each of the holes and a fluid flow device;

one or more valves in communication with the fluid line to control fluid flow in response to an opening/closing control signal;

a sensor provided on the fluid line to detect a state of fluid;

an output device for outputting signals in response to an output control signal; and a controller for selectively applying an opening/closing control signal and an output control signal to the valve and output device, and detecting the position of the wafer by a measurement signal applied from the sensor.

2. The system as claimed in claim 1, wherein the chuck plate wafer supporting surface further includes one or more guide grooves that communicate with the upper portion of each of the holes.

3. The system as claimed in claim 2, wherein the guide groove is formed within the region that is overlaid by wafer placed in a predetermined position on the chuck plate.

4. The system as claimed in claim 3, wherein the guide grooves are arranged in a radial direction or spiral direction.

5. The system as claimed in claim 3, wherein the guide grooves are concentric relative to the center of the wafer position.

6. The system as claimed in claim 4 or 5, wherein the guide grooves include radial, spiral, and circumferential grooves.

7. The system as claimed in claim 3, wherein the fluid line includes the guide grooves.

8. The system as claimed in claim 1, wherein the sensor is a pressure gage.

9. The system as claimed in claim 1, wherein the sensor is a flowmeter line.

10. The system as claimed in claim 1, further comprising one or more optical sensors provided above and the chuck plate where the edge of wafer is placed to thereby detect the position state of the edge of wafer and to output the resultant signal to the controller.

11. The system as claimed in claim 10, wherein the chuck plate is rotatable and connected to a rotational driving device for rotating the chuck plate in response to a rotational control signal selectively outputted from the controller.

12. The system as claimed in claim 1, wherein the output device includes of one or more selected from the group consisting of an audible alarm, a lamp outputting a light signal, a monitor displaying the position state of wafer, and a switching part for selectively cutting off an electric power applied to each of the elements of the system in response to a signal generated by the controller when a wafer is abnormally placed.

13. The semiconductor fabricating facility of using a wafer position detecting system, comprising:

a chamber provided with an opening/closing apparatus for opening or closing the chamber in response to an opening/closing control signal;

a chuck plate rotatably mounted in the chamber, and having a wafer supporting surface with one or more holes formed therein;

a rotational driver connected to the chuck plate to rotate the chuck plate in response to a rotational control signal;

a fluid line communicating with each of the holes to form a fluid path;

a valve provided on the fluid line to control flow of fluid in response to a fluid flow control signal;

a sensor communicating with the fluid line to detect a state of fluid;

an output device for outputting in response to an output control signal;

an optical sensor located above the chuck plate to detect the position state of the edge portion of wafer; and a controller for receiving signals from the sensor and optical sensor to detect the position of the wafer, transmitting the resultant signals to the output device to thereby output a rotational control signal and a fluid flow control signal to the rotational driving means and valve.

14. The facility as claimed in claim 13, wherein the chamber is further provided therein with a vacuum forming apparatus for forming a vacuum state thereof.

15. A wafer position detecting method comprising the steps of:

providing a chuck plate formed with at least one or more holes in a surface thereof on which a wafer is supported; a fluid line communicating with a lower portion of each of the holes; at least one or more valves provided on the fluid line to control fluid flow in response to an opening/closing signal; a sensor provided on the fluid line to detect a state of the fluid; an output device for outputting in response to an output control signal; and a controller for selectively applying an opening/closing signal and an output control signal to the valve and output device, and detecting the position state of wafer by a measurement signal applied from the sensing means, comprising the steps of:

placing a wafer on the chuck plate;

controlling fluid to flow through the fluid line;

detecting a pressure or a fluid flow state in the fluid line;

checking a contact state and position of the wafer on the chuck plate according to whether a measured value is within a predetermined range to control fluid flow through the valve; and outputting through the output device information including the measured values of the pressure or fluid state, set values, and probe gas supplied state.

16. The method as claimed in claim 15, the wafer position detecting system further comprising at least one or more optical sensors provided above the chuck plate to detect the position of the edge of wafer, the method further comprising the step of detecting a position of the edge of wafer by the optical sensor prior to the step of checking the position of wafer.

17. The method as claimed in claim 16, wherein the wafer position detecting system further comprises a rotational driving apparatus to rotate the chuck plate, and further comprising the step of detecting a position of the edge of wafer placed on the chuck plate by the optical sensor.

18. The method as claimed in claim 15, further comprising the step of controlling a fluid flow by the valve when the wafer is improperly placed.

* * * * *

UNITED STATES PATENT AND TRADEMARK OFFICE
CERTIFICATE OF CORRECTION

PATENT NO.    : 6,710,886 B2
DATED         : March 23, 2004
INVENTOR(S)   : Park et al.

It is certified that error appears in the above-identified patent and that said Letters Patent is hereby corrected as shown below:

Column 8,
Line 2, "plate 6 in order" should read -- plate 46 in order --.

Signed and Sealed this

Seventh Day of December, 2004

JON W. DUDAS
*Director of the United States Patent and Trademark Office*